(12) United States Patent
Liu et al.

(10) Patent No.: US 6,486,819 B2
(45) Date of Patent: *Nov. 26, 2002

(54) CIRCUITRY WITH RESISTIVE INPUT IMPEDANCE FOR GENERATING PULSES FROM ANALOG WAVEFORMS

(75) Inventors: Jonathan Tun Nan Liu, Singapore (SG); Jurianto Joe, Singapore (SG); Siong Siew Yong, Singapore (SG); Kin Mun Lye, Singapore (SG)

(73) Assignee: The National University of Singapore, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 09/805,845

(22) Filed: Mar. 13, 2001

(65) Prior Publication Data

US 2001/0010501 A1 Aug. 2, 2001

Related U.S. Application Data

(63) Continuation-in-part of application No. 09/429,527, filed on Oct. 28, 1999.

(51) Int. Cl.[7] .............................. H03M 1/60; H03M 1/00
(52) U.S. Cl. ........................ 341/157; 341/133; 341/111
(58) Field of Search ............................... 341/157, 133, 341/111; 330/284; 331/74; 318/798; 327/514

(56) References Cited

U.S. PATENT DOCUMENTS

| | | | |
|---|---|---|---|
| 3,209,282 A | * 9/1965 | Schnitzler | 331/107 |
| 3,239,832 A | * 3/1966 | Renard | 340/347 |
| 3,246,256 A | * 4/1966 | Sommers, Jr. | 331/107 |
| 3,303,350 A | * 2/1967 | Neff et al. | 307/88.5 |
| 3,312,911 A | 4/1967 | De Boer | |
| 3,387,298 A | * 6/1968 | Kruy | 340/347 |
| 3,527,949 A | * 9/1970 | Huth | 250/199 |
| 3,571,753 A | * 3/1971 | Saunders | 331/111 |
| 3,755,696 A | * 8/1973 | Nicholson et al. | 302/296 |
| 3,761,621 A | * 9/1973 | Vollmeyer et al. | 178/50 |
| 3,846,717 A | * 11/1974 | Fleming | 332/152 |
| 3,967,210 A | 6/1976 | Aumann | |
| 4,028,562 A | 6/1977 | Zuleeg | |
| 4,037,252 A | * 7/1977 | Jansen | 358/128 |
| 4,365,212 A | 12/1982 | Gentile et al. | |
| 4,425,647 A | * 1/1984 | Collins et al. | 371/70 |
| 4,459,591 A | * 7/1984 | Haubner et al. | 340/825.57 |

(List continued on next page.)

FOREIGN PATENT DOCUMENTS

| | | | |
|---|---|---|---|
| DD | 94 855 | 1/1973 | ........... G01R/19/26 |
| DE | 2459531 A1 | 7/1976 | ........... H03K/3/28 |
| DE | 2602794 A1 | 7/1977 | ........... H03B/5/06 |
| DE | 198809334 A1 | 9/1999 | ........... H03M/1/66 |
| FR | 1438262 A | 7/1986 | |
| GB | 1036328 | 7/1966 | ........... H03K/5/08 |
| JP | 11074766 | 3/1999 | ........... H03K/5/00 |

OTHER PUBLICATIONS

Gallerani, A., "Oscillator Meets Three Requirements", EDN Access, pps. 119–120, Dec. 3, 1998.

Abell, E., "Gated Oscillator Emulates a Flip–Flop", EDN Access, pps. 1–2, Mar. 16, 1995.

(List continued on next page.)

*Primary Examiner*—Peguy JeanPierre
(74) *Attorney, Agent, or Firm*—Townsend and Townsend and Crew LLP; Kenneth R. Allen

(57) ABSTRACT

A decoder for generating output pulses or oscillations in response to input analog waveforms includes a circuit having a variable operating point and having a transfer function characterized by an unstable operating region bounded by a first stable operating region and a second stable operating region. In one embodiment, the circuit is characterized by having a resistive input impedance. The analog waveform forces the operating point of the circuit into its unstable and stable regions to produce oscillatory and non-oscillatory behavior at the circuit's output.

16 Claims, 5 Drawing Sheets

U.S. PATENT DOCUMENTS

| | | | | |
|---|---|---|---|---|
| 4,560,949 A | * | 12/1985 | Young | 330/284 |
| 4,599,549 A | * | 7/1986 | Mutoh et al. | 318/798 |
| 4,743,906 A | * | 5/1988 | Fullerton | 342/27 |
| 4,862,160 A | * | 8/1989 | Ekchian et al. | 340/825.54 |
| 5,012,244 A | * | 4/1991 | Wellard et al. | 341/143 |
| 5,107,264 A | | 4/1992 | Novof | |
| 5,170,274 A | * | 12/1992 | Kuwata et al. | 359/182 |
| 5,337,054 A | * | 8/1994 | Ross et al. | 342/93 |
| 5,339,053 A | | 8/1994 | Lux et al. | |
| 5,532,641 A | * | 7/1996 | Balasubramanian et al. | 341/143 |
| 5,764,702 A | * | 6/1998 | Caiaffa | 375/316 |
| 5,777,507 A | * | 7/1998 | Kaminishi et al. | 327/514 |
| 5,789,992 A | * | 8/1998 | Moon | 332/109 |
| 5,812,081 A | * | 9/1998 | Fullerton | 329/311 |
| 5,832,035 A | * | 11/1998 | Fullerton | 342/21 |
| 5,892,701 A | * | 4/1999 | Huang et al. | 375/210 |
| 5,901,172 A | * | 5/1999 | Fontana et al. | 375/326 |
| 6,023,672 A | * | 2/2000 | Ozawa | 364/825 |
| 6,044,113 A | * | 3/2000 | Oltean | 375/238 |
| 6,060,932 A | * | 5/2000 | Devin | 332/115 |
| 6,087,904 A | * | 7/2000 | Wen | 704/222 |
| 6,259,390 B1 | * | 7/2001 | Joe | 341/133 |
| 6,275,544 B1 | * | 8/2001 | Aiello et al. | 341/133 |
| 6,292,067 B1 | * | 9/2001 | Sasabata et al. | 332/178 |

OTHER PUBLICATIONS

L. Goras et al., "On Linear Inductance– and Capacitance–Time Conversions Using NIC–Type Configuration," IEEE Transactions on Industrial Electronics, vol. 40, No. 5 pp. 529–531 (Oct. 1993).

V.H. Jakubaschk, "das Große Elektronikbastelbuch," Deutscher Militärverlag, Leipzig, pp. 206–209 (1968).

James P. Keener, Analog Circuitry for the van der Pol and FitzHugh—Nagumo Equations, IEEE 1983, pp. 1011–1015.

U. Tietze et al., "Halbleiter–Schaltungstechnik, Fünfte, überarbeitete Auflage," Springer–Verlag, Berlin Heidelberg, New York, pp. 255–258 (1980).

Patarasen, S. et al., Maximum–Likelihood Symbol Synchronization and Detection of OPPM Sequeunces, IEEE Transactions on Communications, New York, US, Jun. 94, pp. 9, vol. 42, No. 6.

Sen et al., Integration of GaAs/AlAs Resonant Tunneling Diodes for Digital and Analog Applications with Reduced Circuit Complexity, Oct. 13–16, 1987.

D. Wang et al., "Image Segmentation Based on Oscillatory Correlation," Neural Computation, vol. 9, pp. 805–836 (1997).

Gang Li et al., "Performance of a Ratio–Threshold Diversity Combining Scheme in FFH/FSK Spread Spectrum Systems in Partial Band Noise Interference," Department of Electrical and Computer Engineering, and Communication Research Centre, IEEE 1992, pp. 0672–0676.

Gang Li et al., "Maximum–Likelihood Diversity Combining in Partial–Band Noise Interference Channel," Department of Electrical and Computer Engineering, and Communication Research Centre, IEEE 1993, pp. 507–511.

* cited by examiner

CIRCUITRY WITH RESISTIVE INPUT IMPEDANCE FOR GENERATING PULSES FROM ANALOG WAVEFORMS

CROSS REFERENCE TO RELATED APPLICATIONS

This application is a continuation-in-part of U.S. application Ser. No. 09/429,527 for METHOD AND APPARATUS FOR GENERATING PULSES FROM ANALOG WAVEFORMS, filed Oct. 28, 1999, which is owned by the Assignee of the present invention, and is herein incorporated by reference for all purposes.

This application is related to co-pending U.S. application Ser. No. 09/429,519 for A METHOD AND APPARATUS FOR COMMUNICATION USING PULSE DECODING, filed Oct. 28, 1999 and to concurrently filed and co-owned U.S. application Ser. No. 09/805,854 for "METHOD AND APPARATUS TO RECOVER DATA FROM PULSES," both of which are owned by the Assignee of the present invention and are herein incorporated by reference for all purposes.

BACKGROUND OF THE INVENTION

This invention relates to a waveform to pulse conversion technique and more particularly to techniques for converting arbitrary analog waveforms to sequences of pulses.

Pulse generators are well known, for example, for DC controllers and other applications. However, the typical pulse generator is an adaptation of a conventional oscillator or monostable multivibrator, which can produce undesired or spurious transients when the pulse triggering is terminated. Such transients could be confused with trailing pulses, so that the counting of pulses is an inaccurate representation of the intended pulse count.

A typical pulse generator is responsive to a trigger related to a threshold level; that is, pulses are generated when a level input is applied that exceeds a predetermined threshold that has established a trigger point. The duration of the input above the threshold typically corresponds to the duration of the pulse train or oscillation period.

A classic van der Pol (vdP) oscillator is a simple nonlinear oscillator circuit and is a useful starting point for use as a pulse generator. However, the classic vdP oscillator is not readily controlled.

U.S. application Ser. No. 09/429,527 discloses circuitry that controls oscillations. However, the disclosed circuitry is frequency dependent. In some situations, this is an undesirable property, especially when dealing with a signal that has a broadband frequency spectrum. The power transfer to the circuitry for certain frequency range is better than others. Circuitry is needed which is simple and yet which addresses needs in specialized applications. There is a need for an improved controlled relaxation oscillator.

SUMMARY OF THE INVENTION

According to the invention, a circuit is provided for generating output pulses or oscillations in response to input analog waveforms. The circuit has a variable operating point and a transfer function characterized by an unstable operating region bounded by a first stable operating region and a second stable operating region. The circuit is further characterized by having a resistive input impedance.

The invention will be better understood by reference to the following detailed description in connection with the accompanying drawings.

BRIEF DESCRIPTION OF THE DRAWINGS

The teachings of the present invention can be readily understood by considering the following detailed description in conjunction with the accompanying drawings.

DESCRIPTION OF THE SPECIFIC EMBODIMENTS

Figure 1A:
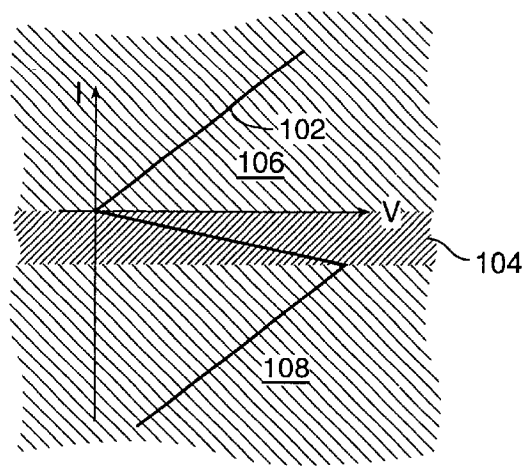
FIGS. 1A and 1B show two types of transfer functions contemplated by the invention.
Figure 1B:
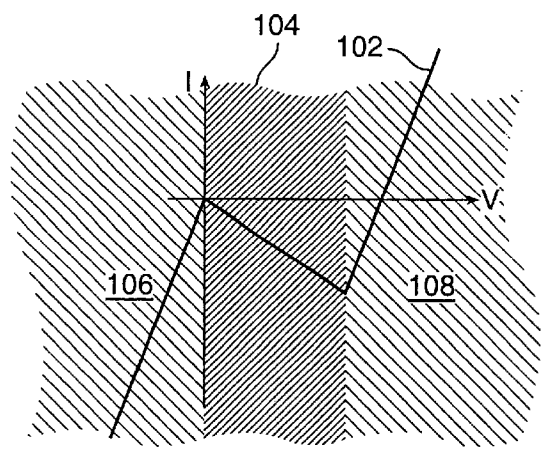

Referring to FIGS. 1A and 1B, the illustrative circuits contemplated by the present invention exhibit a transfer function having either an S-shaped appearance such as shown in FIG. 1A or the N-shaped appearance shown in FIG. 1B. For the purposes of the present invention, the "transfer function" of a circuit refers to the relationship between any two state variables of a circuit. For example, electronic circuits are typically characterized by their I-V curves, relating the two state variables of current and voltage. Such curves indicate how one state variable (e.g., current) changes as the other state variable (voltage) varies. As can be seen in FIGS. 1A and 1B, each transfer function 102 includes a portion which lies within a region 104, referred to herein as an "unstable" region. The unstable region is bounded on either side by regions 106 and 108, each of which is herein referred to as the "stable" region.

A circuit in accordance with the invention has an associated "operating point" which is defined as its location on the transfer function 102. The nature of the output of the circuit depends on the location of its operating point. If the operating point is positioned along the portion of the transfer function that lies within region 104, the output of the circuit will exhibit an oscillatory behavior. Hence, the region 104 in which this portion of the transfer function is found is referred to as an unstable region. If the operating point is positioned along the portions of the transfer function that lie within either of regions 106 and 108, the output of the circuit will exhibit a generally time-varying but otherwise non-oscillatory behavior. For this reason, regions 106 and 108 are referred to as stable regions.

In accordance with the present invention, any arbitrary waveform can be used. Illustrative example waveforms include sinusoidal, ramp, asymmetric, sawtooth, square and channel-optimized symbol. For example, sinusoidal waveforms with frequency f1 and f2 are used to represent binary 0 and 1. It is desired to receive these two sinusoidal waveforms with equal amplitude. However, the channel will attenuate one frequency, say f2, more than it will to f1. Therefore, at the transmitter end, the amplitude of sinusoidal waveform with frequency f2 can be increased to compensate for the expected higher loss in the channel such that when the waveforms are received, the amplitude of the two sinusoidal waveforms are equal. The disclosed list of waveforms is not exhaustive, of course. Rather, it is intended to illustrate the fact that various waveforms can be used.

In a more general case, a mixture of different analog waveforms can be used. Thus, the information can be represented by a sine wave for a period of time, and then by other waveformns at other times. In the most general case, it is possible to vary the waveform from one cycle to the next.

It is only required that there be a corresponding circuit which has stable regions and at least one unstable region as described above, whose operating point can be selectively forced between the unstable and stable regions. In practice of course, appropriate channel-optimized waveforms would be selected to represent symbols for transmission.

At the receiving end, the received transmission is fed into the input of a circuit as described above. The transmitted information can then be extracted (recovered) from the resulting oscillatory and non-oscillatory behavior of the circuit. Circuitry for such information recovery is disclosed in, but not limited, commonly owned, pending U.S. application Ser. No. 09/429,527, entitled "Method and Apparatus for Generating Pulses From Analog Waveforms" and in commonly owned, concurrently filed, co-pending U.S. application 09/805,854 entitled "Method and Apparatus to Recover Data From Pulses", both of which are incorporated herein by reference for all purposes.

The advantage of the present invention lies in the ability to select some arbitrary combination of arbitrary analog waveforms to represent information. Such information can then be transmitted by selecting waveforms which are appropriate for transmission by conventional methods. Hence, any conventional transmission medium, wireless or wired, can be used with the invention.

A configuration for varying the operating point of a circuit is described in the related application U.S. application Ser. No. 09/429,527, and is shown here as FIG. 2. The figure shows a circuit 202 having inputs 203 and 205. A capacitive element 204 is coupled at one end to an input 205. An arbitrary analog waveform source 210 is coupled between an input 203 and the other end of capacitive element 204, thus completing the circuit. For the purpose of the discussion, circuit 202 has a transfer function which appears S-shaped. The circuit arrangement shown in FIG. 2 allows the slope of the arbitrary waveform generator 210 to move the operating point of circuit 202 into and out of the unstable region 104. This action controls the onset of oscillatory behavior, and cessation of such oscillatory behavior, at the output of circuit 202 as a function of the output of arbitrary waveform generator 210.

Figure 2:
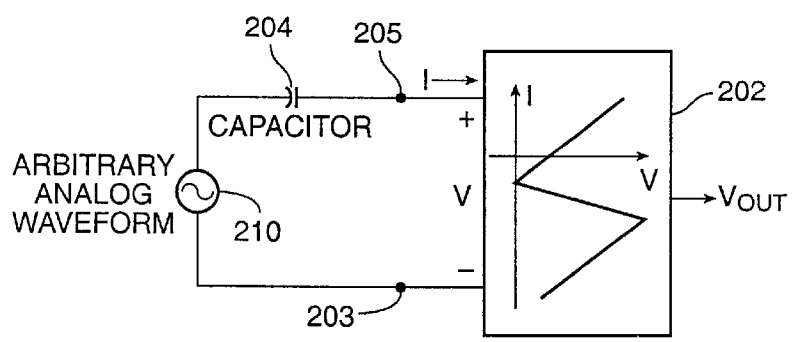
FIGS. 2 and 3 show circuit arrangements for forcing the operating point between stable and unstable regions of operation.
Figure 3:
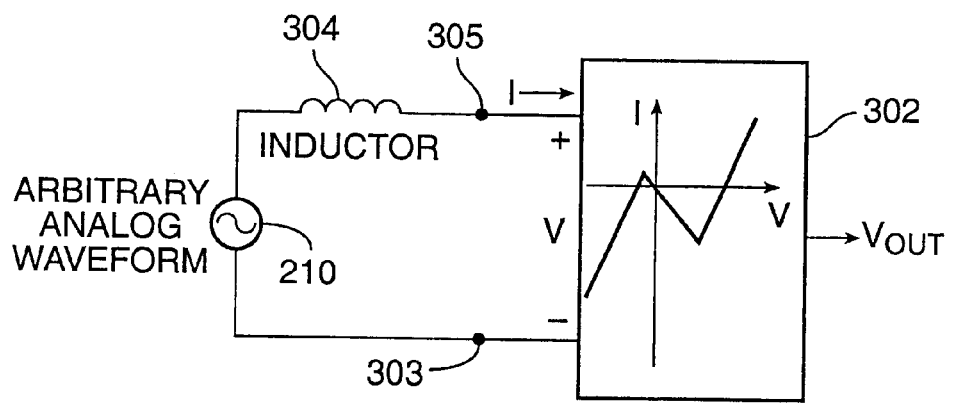

Another configuration for varying the operating point of a circuit is also described in the related application U.S. application Ser. No. 09/429,527, and is shown here as FIG. 3. In this case, the circuit 302 has an N-shaped transfer function. In place of the capacitive element, an inductive element 304 is provided. As with FIG. 2, an arbitrary analog waveform source 210 completes the circuit. Both FIGS. 2 and 3 are using op-amp to realize N-Shape or S-Shape I-V transfer functions. By a thorough investigation into the op-amp model, the unstable region corresponds to op-amp linear operation and stable region corresponds to non-linear operation. Hence, both op-am linear and non-linear operations are required to form N-shaped or S-shaped transfer functions.

However, the input impedances of the foregoing oscillators are reactive. Thus, the input impedance seen by the source is frequency dependent. This effect is undesirable since the analog waveform used as the source has a broadband frequency spectrum. Thus, in order to provide a flat response across the anticipated range of frequencies, broadband matching techniques must be used. However, broadband matching itself is a difficult process, adding undesired complexity and cost to the end system. Therefore, it was desired to attain a configuration having a resistive input impedance for operation in the linear and non-linear regimes as discussed above which still permitted driving the circuit in and out of its unstable region. Because of the dual requirement that these op-amp circuits operate both in linear and non-linear regimes, it is not obvious as how to find the resistive equivalent of the controlled oscillator circuits shown in FIGS. 2 and 3.

Figure 4:
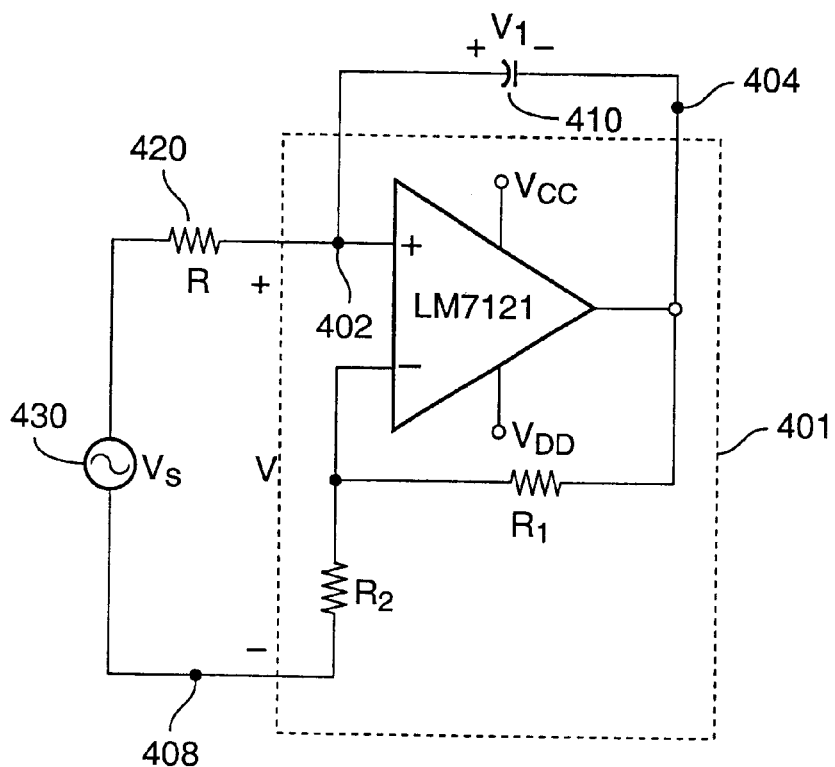
FIG. 4 shows an embodiment of a circuit arrangement according to the present invention.
Figure 5:
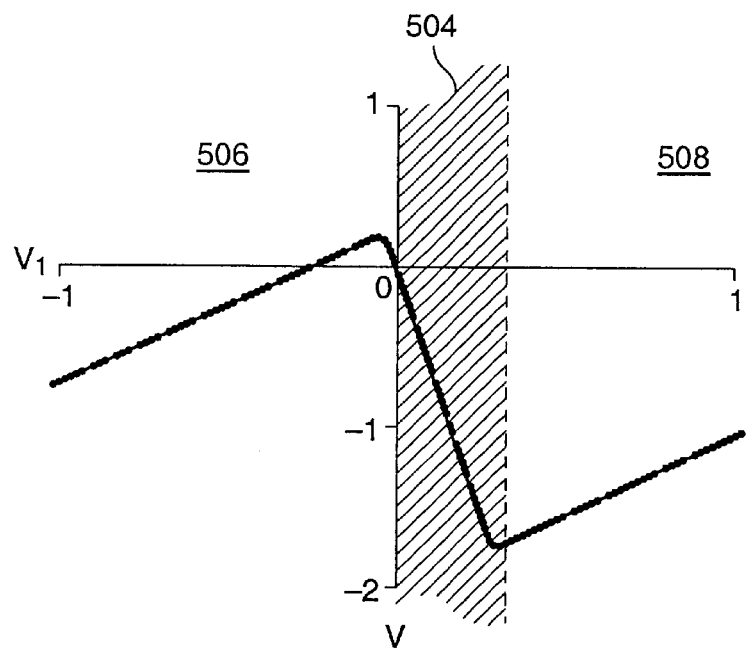
FIG. 5 is the transfer function characterizing the circuit shown in FIG. 4.

Turning to FIGS. 4 and 5, an illustrative circuit according to an embodiment of the invention exhibits a "controlled" relaxation oscillation behavior. In the context of the present invention, the term "controlled relaxation oscillations" refers to the operation of the circuitry in such a way that the number of desired oscillations can be generated followed by a substantially instantaneous termination of the oscillations. Conversely, the circuit is able to respond, substantially without transients, from a non-oscillatory condition to an oscillatory state to yield a desired number of oscillations.

Unexpectedly, the circuit 401 shown in FIG. 4 exhibits the desired combination of a resistive input impedance circuit having controlled relaxation oscillations. The op-amp used is an LM7121 operational amplifier. A negative feedback path is provided by a voltage divider circuit comprising resistors $R_1$ and $R_2$. Nodes 402 and 404 are connected by a capacitor 410. One end of a resistor 420 is connected to node 402. An analog waveform source 430 is coupled across the other end of resistor 420 and node 408 to complete the circuit. The analog waveform source represents a received signal from which the pulses will be extracted.

The oscillator circuit shown in FIG. 4 has the transfer function as described above in connection with FIG. 1B. The graph of FIG. 1B is based on the I-V characteristic (current and voltage relations) to represent the transfer function. In this embodiment of the invention, however, the transfer function characterizing the circuit of FIG. 4 is based on the relationship between two voltages $V_1$ and $V$ in the circuit, shown in FIG. 5. An unstable region of operation 504 is bounded by two stable regions of operation 506, 508.

The transfer function shown in FIG. 5 is obtained by properly biasing the op-amp through pin $V_{cc}$ and $V_{dd}$. The unstable region is defined as a region where $dV_1/dV$ is negative and the stable region is defined as a region where $dV_1/dV$ is positive.

As an illustrative example, the transfer function shown in FIG. 5 can be obtained by a circuit configured with the following parameters: $V_{cc}$ and $V_{dd}$ are set to 3.5V and −1.5 V respectively. The corresponding values for $R_1$ and $R_2$ are 63 Ω and 10 Ω, respectively.

The governing equations for the circuit in FIG. 4 are the following:

$$V_1 = \Psi(V) \qquad \text{Eqn. 1}$$

$$C\frac{dV_1}{dt} = \frac{V_s - V}{R} \qquad \text{Eqn. 2}$$

Eqn. 1 represents the relation between $V_1$ and V. The operating point of the circuit can be obtained by setting $dV_1/dt$ to zero in Eqn. 2 and finding the intersection with $V_1=\Psi(V)$. By moving this operating point into and out of the unstable region 504 as explained above, a controlled relaxation oscillation behavior will be accomplished. In this particular case, the amplitude of the analog waveform source 430 controls the operating point. The analog waveform source represents a received signal from which the pulses will be extracted.

Figure 6:
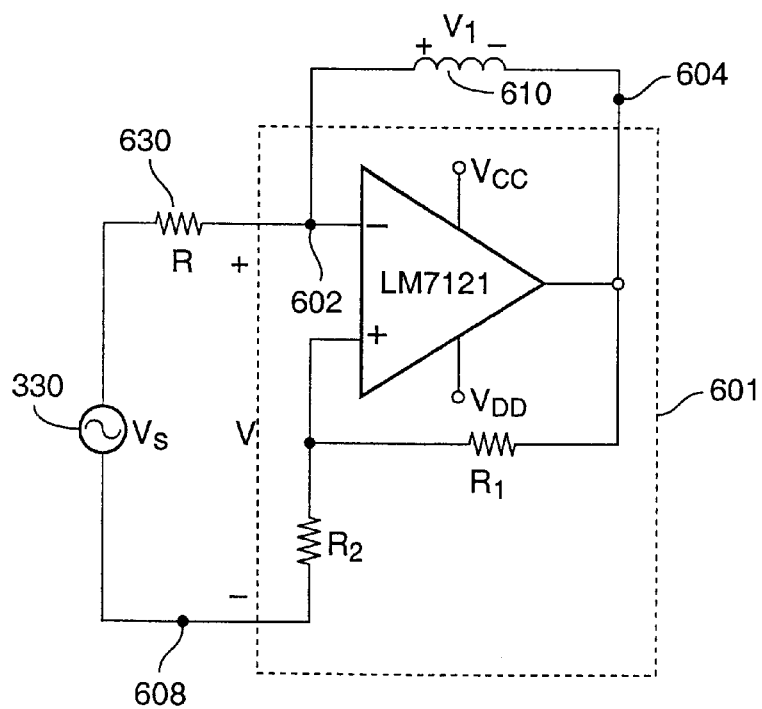
FIG. 6 shows an alternate embodiment of a circuit arrangement according to the present invention.
Figure 7:
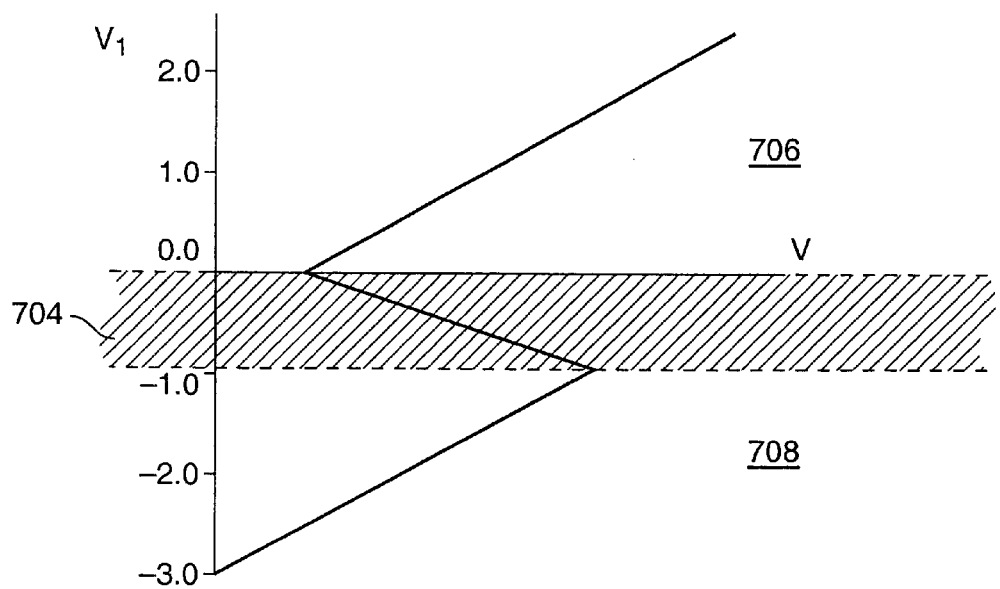
FIG. 7 is the transfer function characterizing the circuit shown in FIG. 6.

FIGS. 6 and 7 show yet another illustrative circuit exhibiting the controlled relaxation oscillation behavior according to another embodiment of the invention. The circuit 601 includes an inductor 620 connected between nodes 602 and 604. An analog waveform source 330 is connected to node 608 and one end of a resistor 630. The other end of resistor 630 is connected to terminal 602 to complete the circuit.

The oscillator circuit shown in FIG. 6 has the transfer function as described above in connection with FIG. 1A. The graph of FIG. 1A is based on the I-V characteristic (current and voltage relations) to represent the transfer function. In this embodiment of the invention, however, the transfer function characterizing the circuit of FIG. 6 is based on the relationship between two voltages $V_1$ and V in the circuit, shown in FIG. 7. An unstable region of operation 704 is bounded by two stable regions of operation 706, 708.

The transfer function shown in FIG. 7 is obtained by properly biasing the op-amp through pin $V_{cc}$ and $V_{dd}$. The unstable region 704 is defined as a region where $dV_1/dV$ is negative and the stable regions 706, 708 each is defined as a region where $dV_1/dV$ is positive. As an illustrative example, the transfer function shown in FIG. 7 can be obtained by a circuit configured with the following parameters: $V_{cc}$ and $V_{dd}$ are set to 3.5V and −1.5 V respectively. The corresponding values for $R_1$ and $R_2$ are 63 Ω and 10 Ω, respectively.

Eqns. 6 and 7 below govern the whole circuit:

$$V=\Psi(V_1) \quad \text{Eqn. 3}$$

$$\frac{dV}{dt} = \frac{dV_s}{dt} - \frac{R}{L}V_1 \quad \text{Eqn. 4}$$

The operating point can be found by solving Eqns. 3 and 4 simultaneously with dV/dt set to zero in Eqn. 4. It turns out the slope of the analog waveform source 330 controls the operating point for this type of controlled relaxation oscillator.

In general, negative $dV_1/dV$ and positive $dV_1/dV$ correspond to linear and non-linear operating regimes of an op-amp, respectively. This finding is consistent with what was observed in the op-amp controlled oscillators depicted in FIGS. 2 and 3.

Figure 8:
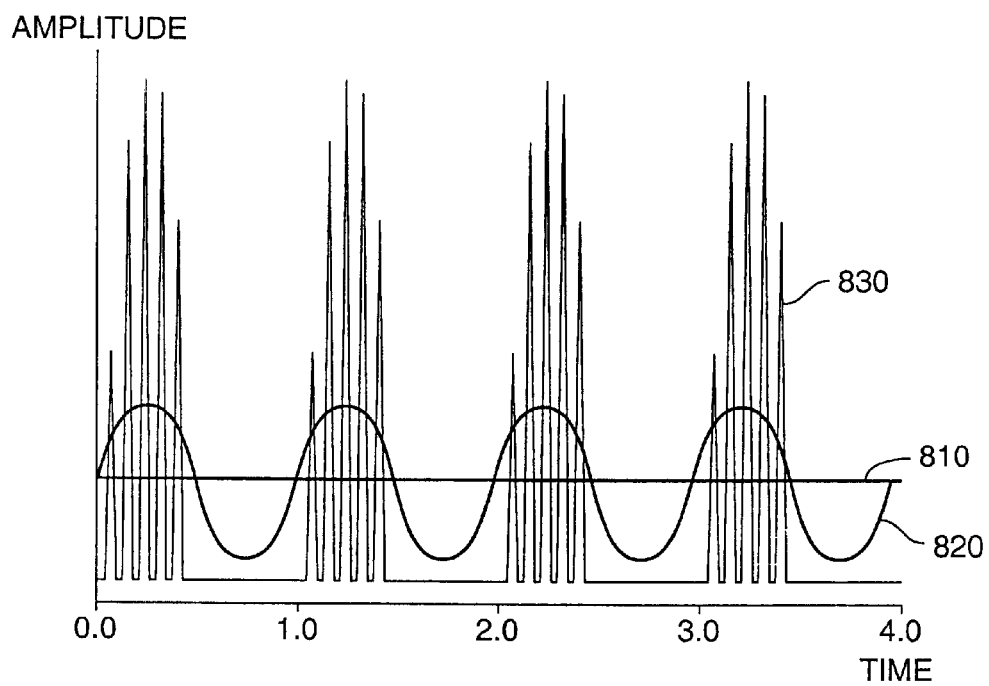
FIGS. 8 and 9 are signal traces illustrating the operation of the circuits shown in FIGS. 4 and 6, respectively.

FIG. 8 illustrates a typical response of the controlled relaxation oscillator depicted in FIG. 4. Line 810 is AC ground of the analog waveform 820. It can be seen from the figure that when the amplitude of the analog waveform 820 is above line 810, oscillation starts. Conversely, when the amplitude of the analog waveform 820 is below line 810, the oscillation stops instantaneously. Trace 830 was obtained by taking measurements at the output of a prototype of the circuit shown FIG. 4, confirming such a response. This means the operating point is moved into the unstable region 504 of the transfer function $V_1$-V (FIG. 5) when the analog waveform amplitude 820 is above line 810.

Figure 9:
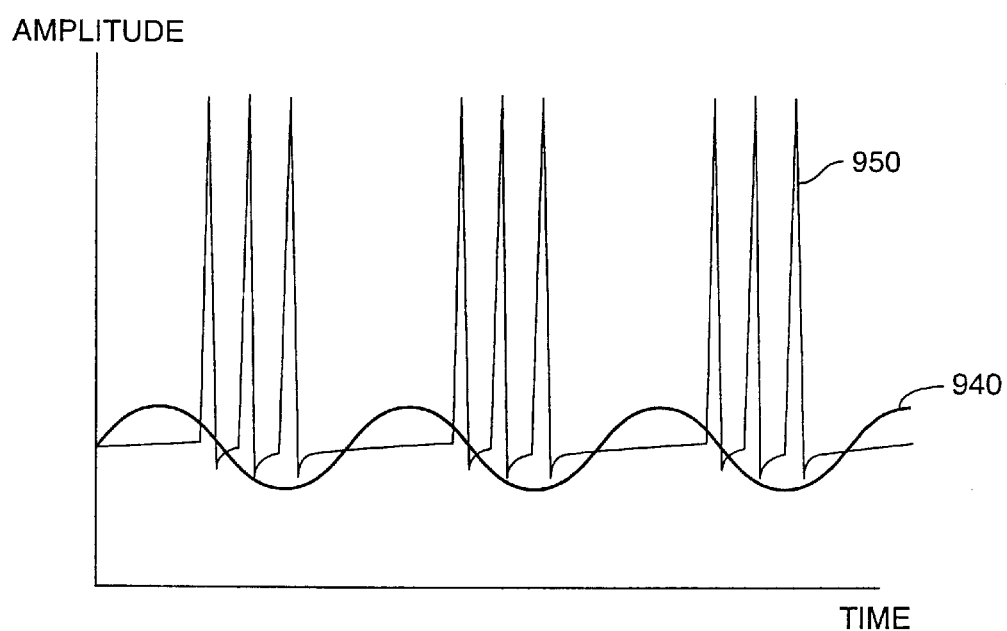

FIG. 9 illustrates the response of a controlled relaxation oscillator shown in FIG. 6. Eqn. 4 indicates that the operating point is controlled by the derivative of the analog waveform dVs/dt. As can be seen FIG. 9, trace 940 is the analog waveform. Trace 950 represents sequence of the start and stop of the oscillations instantaneously. Unlike trace 830 of FIG. 8, trace 950 exhibits oscillations when the derivative of the analog waveform 940 is negative and stops oscillating when the derivative is positive. This means the operating point is moved into the unstable region 704 of the transfer function $V_1$-V (FIG. 7) when dVs/dt is negative.

This invention has been explained with reference to specific embodiments. Various circuits with resistive input impedance for generating pulses from analog waveforms have been presented. Resistive input impedance is easily matched to other circuits because it is independent of frequency. Hence, broadband matching is not an issue. Based on the teachings of the foregoing disclosure, other embodiments in accordance with the invention will be evident to those of ordinary skill in the art. It is therefore not intended that this invention be limited except as indicated by the appended claims.

What is claimed is:

1. A decoding system for generating pulses from analog waveforms comprising:

a source of a known but arbitrary analog waveform, each said analog waveform having a first information region and a second information region; and a circuit with a variable operating point and having a transfer function characterized by an unstable operating region bounded by a first stable operating region and a second stable operating region, said circuit having a resistive input impedance, said circuit being responsive to sensing of said first information region to force said variable operating point to vary in order to initiate operation of said circuit in said unstable operating region to produce at least one oscillation, said oscillation having a frequency greater than rate of change of said operating point, said circuit being further responsive to sensing of said second information region to force said variable operating point to vary into either one of said stable operating regions in order to terminate said at least one oscillation substantially without transients, wherein said initiating and said terminating alternate.

2. The system according to claim 1, wherein said analog waveform is cyclical.

3. The system of claim 1, wherein said analog waveform is selected from the group consisting of sinusoidal, ramp, asymmetric, sawtooth, square and channel-optimized symbol.

4. The system according to claim 1, wherein said analog waveform is cyclical and wherein said cycles comprise mixtures of different waveform types, including time-varying channel-optimized symbols.

5. The system according to claim 1 wherein said at least one oscillation has a peak to peak amplitude of at least zero to a maximum relative to non-oscillation.

6. The system according to claim 1 wherein said circuit includes a negative impedance element, wherein said unstable operating region is a negative impedance region, and wherein said operating point is forced into said unstable region by a time varying input signal.

7. The system according to claim 1 wherein said circuit includes an operational amplifier circuit with feedback, and having series input through a resistive element, wherein said unstable operating region is a negative resistance region, and wherein said operating point is forced into said unstable region by a changing voltage applied to said capacitor.

8. The system according to claim 1 wherein said analog signal originates from a transmitted signal.

9. A decoder for generating pulses from analog waveforms comprising:
- a first circuit for producing a known but arbitrary analog waveform, each said analog waveform having a first information region and a second information region; and
- a second circuit having at least one input and an output,
- said second circuit further having a feedback path comprising a reactive element coupled between said output said at least one input,
- said second circuit having a variable operating point,
- said second circuit further having a transfer function characterized by an unstable operating region bounded by a first stable operating region and a second stable operating region,
- said second circuit being responsive to sensing of said first information region to force said variable operating point to vary in order to initiate operation of said circuit in said unstable operating region to produce at least one oscillation, said oscillation having a frequency greater than rate of change of said operating point,
- said circuit being further responsive to sensing of said second information region to force said variable operating point to vary into either one of said stable operating regions in order to terminate said at least one oscillation substantially without transients,
- wherein said initiating and said terminating alternate.

10. The decoder according to claim 9 wherein said reactive element is a capacitor.

11. The decoder according to claim 9 wherein said reactive element is an inductor.

12. The decoder according to claim 9, wherein said analog waveform is cyclical.

13. The decoder of claim 9, wherein said analog waveform is selected from the group consisting of sinusoidal, ramp, asymmetric, sawtooth, square and channel-optimized symbol.

14. The decoder according to claim 9, wherein said analog waveform is cyclical and wherein said cycles comprise mixtures of different waveform types, including time-varying channel-optimized symbols.

15. The decoder according to claim 9 wherein said at least one oscillation has a peak to peak amplitude of at least zero to a maximum relative to non-oscillation.

16. The decoder according to claim 9 wherein said circuit includes a negative impedance element, wherein said unstable operating region is a negative impedance region, and wherein said operating point is forced into said unstable region by a time varying input signal.

* * * * *